United States Patent
Grieb et al.

(10) Patent No.: US 10,608,105 B2
(45) Date of Patent: Mar. 31, 2020

(54) MOS FIELD-EFFECT TRANSISTOR AND METHOD FOR THE PRODUCTION THEREOF

(71) Applicant: Robert Bosch GmbH, Stuttgart (DE)

(72) Inventors: Michael Grieb, Renningen-Malmsheim (DE); Achim Trautmann, Leonberg (DE); Ning Qu, Reutlingen (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 14/891,907

(22) PCT Filed: Mar. 11, 2014

(86) PCT No.: PCT/EP2014/054643
§ 371 (c)(1),
(2) Date: Nov. 17, 2015

(87) PCT Pub. No.: WO2014/183897
PCT Pub. Date: Nov. 20, 2014

(65) Prior Publication Data
US 2016/0118494 A1    Apr. 28, 2016

(30) Foreign Application Priority Data
May 17, 2013   (DE) .................. 10 2013 209 256

(51) Int. Cl.
*H01L 29/78* (2006.01)
*H01L 29/10* (2006.01)
(Continued)

(52) U.S. Cl.
CPC ........ *H01L 29/7813* (2013.01); *H01L 21/046* (2013.01); *H01L 21/049* (2013.01);
(Continued)

(58) Field of Classification Search
CPC ............ H01L 29/7813; H01L 29/1095; H01L 29/4236; H01L 29/66734; H01L 21/26513; H01L 29/1608
See application file for complete search history.

(56) References Cited

U.S. PATENT DOCUMENTS

| | | | |
|---|---|---|---|
| 2005/0133861 A1 | 6/2005 | Mizokuchi et al. | |
| 2008/0012026 A1* | 1/2008 | Tsuji | H01L 21/047 |
| | | | 257/77 |

(Continued)

FOREIGN PATENT DOCUMENTS

| | | |
|---|---|---|
| CN | 101336484 A | 12/2008 |
| EP | 0889511 | 1/1999 |

(Continued)

OTHER PUBLICATIONS

International Search Report for PCT/EP2014/054643, dated Apr. 24, 2014.

*Primary Examiner* — Ermias T Woldegeorgis
(74) *Attorney, Agent, or Firm* — Norton Rose Fulbright US LLP; Gerard Messina

(57) ABSTRACT

A substrate for a metal oxide semiconductor field effect transistor, and a metal oxide semiconductor field effect transistor, are made available. The substrate encompasses: an n-doped epitaxial drift zone, a $p^-$-doped epitaxial first layer disposed on the drift zone, a heavily n-doped second layer disposed on the first layer, and a terminal formed by $p^+$ implantation, the first layer being in electrical contact with the terminal and being disposed laterally between the terminal and a trench, the trench being formed in the drift zone, in the first layer, and in the second layer. The substrate is characterized in that an implantation depth (P) of the $p^+$ implantation is at least as great as a depth of the trench. The deep $p^+$ implantation can separate adjacent trenches in such (Continued)

a way that a field can no longer attack a gate oxide because it is directed around the gate oxide.

12 Claims, 2 Drawing Sheets

(51) Int. Cl.
H01L 29/16 (2006.01)
H01L 29/66 (2006.01)
H01L 29/417 (2006.01)
H01L 21/04 (2006.01)
H01L 21/265 (2006.01)
H01L 29/423 (2006.01)

(52) U.S. Cl.
CPC .... *H01L 21/26513* (2013.01); *H01L 29/1095* (2013.01); *H01L 29/1608* (2013.01); *H01L 29/41766* (2013.01); *H01L 29/4236* (2013.01); *H01L 29/66068* (2013.01); *H01L 29/66734* (2013.01)

(56) References Cited

U.S. PATENT DOCUMENTS

| | | | |
|---|---|---|---|
| 2008/0116512 A1 | 5/2008 | Kawaguchi et al. | |
| 2009/0072241 A1* | 3/2009 | Harris | H01L 29/0623 257/77 |
| 2009/0114969 A1* | 5/2009 | Suzuki | H01L 29/0619 257/301 |
| 2012/0261714 A1 | 10/2012 | Taketani et al. | |

FOREIGN PATENT DOCUMENTS

| | | |
|---|---|---|
| JP | H1098188 A | 4/1998 |
| JP | 2003347545 A | 12/2003 |
| JP | 2006026324 A | 2/2006 |
| JP | 2006514443 A | 4/2006 |
| JP | 2009043966 A | 2/2009 |
| JP | 2009260253 A | 11/2009 |
| JP | 2010258386 A | 11/2010 |
| JP | 2013084899 A | 5/2013 |
| WO | WO97/47045 | 12/1997 |

\* cited by examiner

Existing Art

MOS FIELD-EFFECT TRANSISTOR AND METHOD FOR THE PRODUCTION THEREOF

FIELD OF THE INVENTION

The present invention relates to a metal oxide semiconductor field effect transistor and to a method for manufacturing a metal oxide semiconductor field effect transistor.

BACKGROUND INFORMATION

Substrates that encompass a silicon carbide layer are increasingly being used for standard components. Power semiconductors that block at voltages up to and above 1.2 kV, for example, are implemented as trench metal oxide semiconductor field effect transistors (trench MOSFETs) using such substrates. Power semiconductors of this kind are utilized, for example, in electric-vehicle applications, i.e. motor vehicles having batteries, for example batteries based on lithium ion cells, or in photovoltaic facilities. Microelectromechanical systems can also be implemented using such substrates. For microelectromechanical systems, the substrate can furthermore encompass a silicon dioxide layer, a silicon nitrate layer, or a silicon layer, on which the silicon carbide layer is deposited.

A trench MOSFET substrate is implemented, for example, using a substrate (n-doped 4H-SiC substrate) whose silicon carbide layer has a hexagonal crystal structure, and which is n-doped. An n-doped epitaxial silicon carbide buffer layer is disposed between the silicon carbide layer and a lightly n-doped epitaxial silicon carbide drift zone (n-drift zone).

FIG. 1 shows an implementation of this kind, according to the existing art, of a trench MOSFET 100. A heavily p-doped silicon carbide layer ($p^-$ layer) 20, which can be epitaxially grown or implanted, is disposed on the n-doped 4H-SiC substrate 10. A heavily n-doped silicon carbide layer ($n^+$ source) 30, which likewise can be epitaxially grown or implanted and serves as a source terminal, is disposed on part of $p^-$ layer 20. A back side of 4H-SiC substrate 10 serves as a drain terminal. In addition to $n^+$ source 30, a $p^+$terminal ($p^+$ plug) 40 is also implanted into $p^-$ layer 20, so that an upper side of $p^+$plug 40 abuts against the upper side of $n^+$ source 30, and $p^+$plug 40 can serve to define the channel potential. $p^-$ layer 20 and $n^+$ source 30 are each patterned by way of a cutout that is disposed above a trench with which n-drift zone 10 is patterned. The cutouts have a constant width in cross section. The trench also has a constant width except for a bottom region. The width of the trench tapers only in the bottom region as a result of the patterning, so that the trench has a cup-shaped profile in cross section. The trench is thus convex in cross section.

The trench can be coated with a gate oxide after patterning. Alternatively or additionally, heavily doped implantation (60) can occur in the bottom of the trench. A gate electrode 50 is then deposited into the trench, thus producing a vertical channel region in $p^-$ layer 20. This permits a higher packing density of parallel-connected transistors than in the case of transistors having a lateral channel region.

The patterning-related transition from the side wall of the trench to the bottom of the trench can result in very high field strengths in this region during utilization, these strengths being higher than a breakdown threshold at which the oxide layer is electrically broken down when blocked, and the component becomes damaged.

SUMMARY

The present invention makes available a substrate for a metal oxide semiconductor field effect transistor, and a method for manufacturing such a substrate. The present invention also makes available a metal oxide semiconductor field effect transistor, and a method for manufacturing a metal oxide semiconductor field effect transistor of this kind. Lastly, a motor vehicle is also made available by the present invention.

The substrate presented according to the present invention encompasses the following: an n-doped epitaxial drift zone, a $p^-$-doped epitaxial first layer disposed on the drift zone, a heavily n-doped second layer disposed on the first layer, and a terminal formed by $p^+$ implantation, the first layer being in electrical contact with the terminal and being disposed laterally between the terminal and a trench, the trench being formed in the first layer, in the second layer, and in the drift zone. The substrate is characterized in that an implantation depth of the $p^+$ implantation is at least as great as a depth of the trench.

The deep $p^+$ implantation can separate adjacent trenches in such a way that a field can no longer attack a gate oxide because it is directed around the gate oxide. The body diode can moreover be embodied as a pure pn diode.

For use of the substrate as a metal oxide semiconductor field effect transistor, in an embodiment a gate electrode can be disposed in the trench in such a way that a vertical channel region can be formed in the first layer.

The gate electrode can be formed on an oxide layer that covers at least a bottom of the trench. This prevents a current flow from occurring between the vertical channel region and the gate terminal.

The terminal can be formed in the first layer and in the drift zone. In particular, the terminal can be formed exclusively in the first layer and in the drift zone, in a region of the first layer in which the latter is not covered by the second layer, the second layer being partly removed in the region so that a trough is produced. The total thickness of the terminal is then less, and implanters having a lesser implantation depth can be used.

The terminal can, however, also furthermore be formed in the second layer. This enables compatibility with components designed for metal oxide semiconductor field effect transistors according to the existing art.

The implantation depth can be a hundred nanometers or several hundred nanometers deeper than the depth of the trench. Particularly good shielding of the gate oxide can then be achieved.

The metal oxide semiconductor field effect transistor presented according to the present invention encompasses an n-doped epitaxial drift zone, a $p^-$-doped epitaxial first layer disposed on the drift zone, and a heavily n-doped second layer disposed on the first layer. Also encompassed is a terminal, formed by $p^+$ implantation, with which the first layer is in electrical contact. A trench, in which an oxide layer and thereupon a gate electrode are disposed so that the first layer is disposed laterally between the trench and terminal, is formed in the first layer, in the second layer, and in the drift zone, so that a vertical channel region can be formed in the first layer. The metal oxide semiconductor field effect transistor is characterized in that an implantation depth of the $p^+$ implantation is at least as great as a depth of the trench.

The deep $p^+$ implantation can separate adjacent trenches in such a way that a field can no longer attack a gate oxide because it is directed around the gate oxide. The body diode can moreover be embodied as a pure pn diode.

The method presented according to the present invention for manufacturing a metal oxide semiconductor field effect transistor encompasses the steps of: furnishing a n-doped epitaxial drift zone, disposing a p⁻-doped epitaxial first layer on the drift zone and a heavily n-doped second layer on the first layer, and forming a terminal by p⁺ implantation so that the first layer is in electrical contact with the terminal. Further steps are: forming a trench in the first layer, in the second layer, and in the drift zone; forming a gate oxide in the trench; and disposing a gate electrode in the trench so that the first layer is disposed laterally between the trench and terminal, so that a vertical channel region can be formed in the first layer. The method is characterized in that an implantation depth of the p⁺ implantation is at least as great as a depth of the trench.

The motor vehicle presented according to the present invention encompasses a power switch that encompasses the metal oxide semiconductor field effect transistor presented according to the present invention.

DETAILED DESCRIPTION

A p⁺ implantation that is at least as large as a depth of the trench, as utilized in the various aspects of the invention, can be implemented in a variety of ways.

Figure 1:
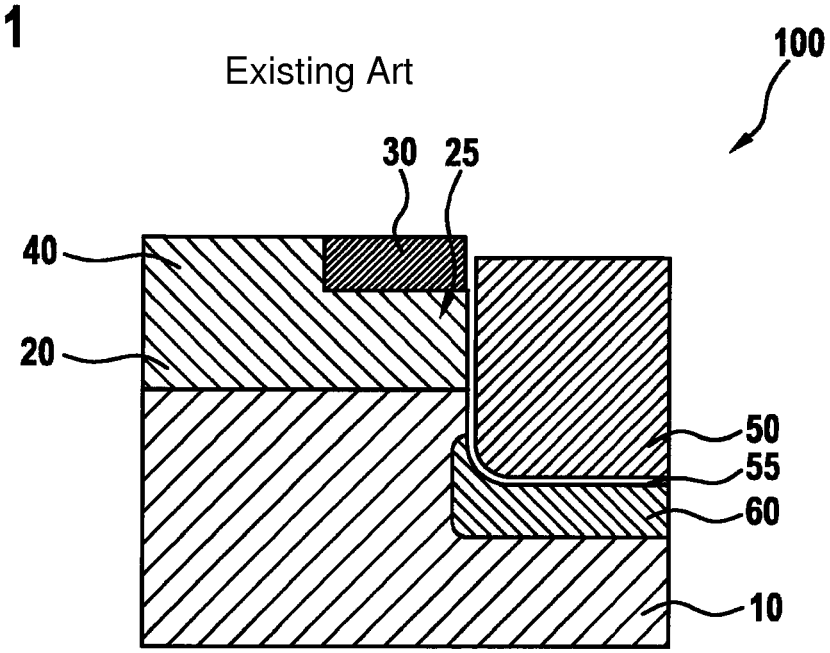
FIG. 1 shows a trench MOSFET according to the existing art.
Figure 2:
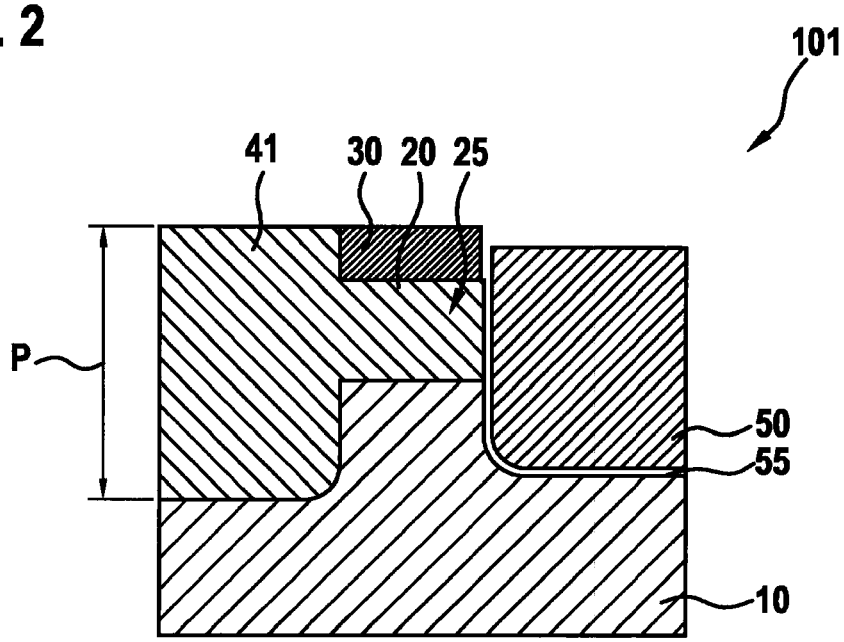
FIG. 2 shows a trench MOSFET according to a first exemplifying embodiment of the invention.
Figure 3:
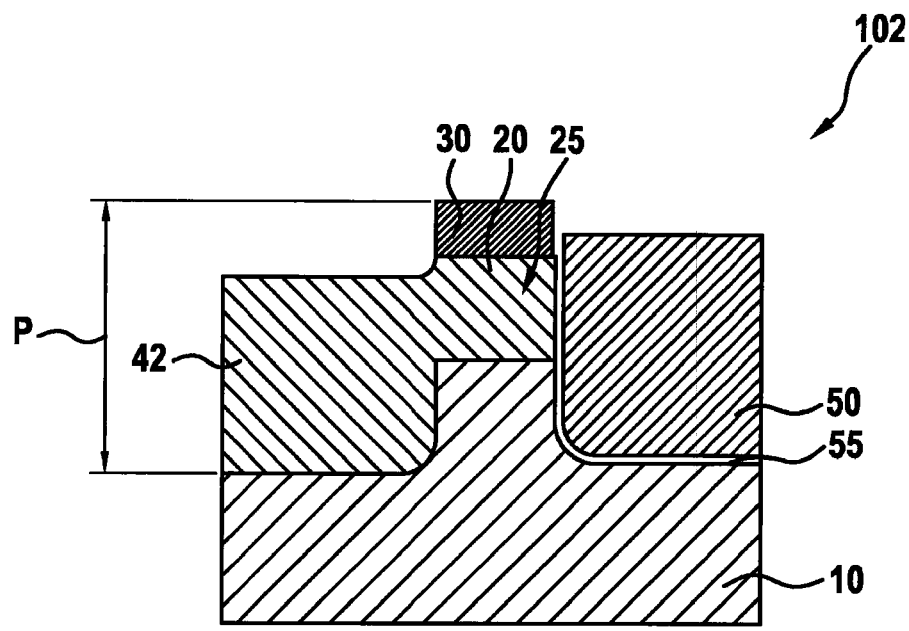
FIG. 3 shows a trench MOSFET according to a second exemplifying embodiment of the invention.
Figure 4:
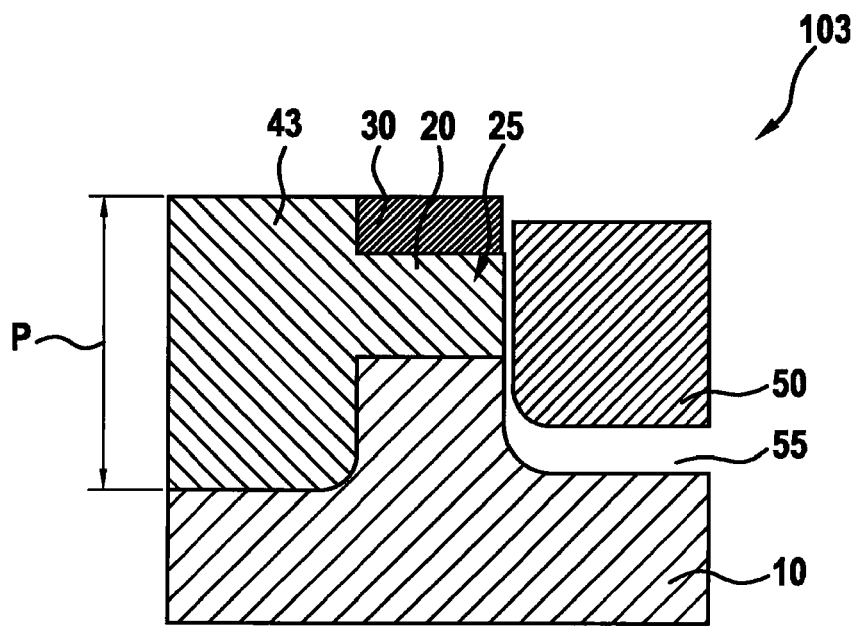
FIG. 4 shows a trench MOSFET according to a third exemplifying embodiment of the invention.

FIGS. 2, 3, and 4 show exemplifying embodiments of trench MOSFET 101, 102, 103 according to the present invention that can be utilized, for example, in a power switch for a motor vehicle.

An example of a material for the embodiments of trench MOSFET 101, 102, 103 according to the present invention is an n-doped silicon carbide layer having a hexagonal crystal structure (4H-SiC substrate) and a lightly n-doped epitaxial silicon carbide drift zone (n-drift zone) 10, between which an n-doped silicon carbide buffer layer is disposed. Constructed thereon is a heavily p-doped epitaxial silicon carbide layer (p⁻ layer) 20. A heavily n-doped silicon carbide layer (n⁺ source) 30 is epitaxially grown or implanted as the next layer. This n-doped silicon carbide layer 30 serves as a source terminal. A back side of 4H-SiC substrate 10 serves as a drain terminal.

In a lateral region of the substrate, a terminal 41, 42 that is in electrical contact with first layer 20 is implemented by p⁺ implantation at least in first layer 20 and in drift zone 10. A trench is implemented in another lateral region of the substrate. The p⁻ layer 20 and n⁺ source 30 are disposed between the lateral region and the other lateral region. A gate oxide 55, on which a gate electrode 50 made e.g. of polycrystalline silicon is disposed, is deposited at least at the bottom of the trench. An implantation depth P of the p⁺ implantation is at least as great as a depth of the trench.

Gate oxide 55 can also be deposited additionally on side walls of the trench.

FIG. 2 shows a trench MOSFET 101 according to a first exemplifying embodiment of the invention. Here terminal 41 is implanted into drift zone 10, into first layer 20, and into second layer 30. An upper side of terminal 41 thus abuts laterally against an upper side of n⁺ source 30.

FIG. 3 shows a trench MOSFET 102 according to a second exemplifying embodiment of the invention. Here terminal 42 is implanted only into drift zone 10 and into first layer 20. Second layer 30 and a portion of first layer 20 were removed prior to implantation. An upper side of terminal 42 is thus located both lower down than an upper side of n⁺ source 30 and lower down than an upper side of p⁻ layer 20.

FIG. 4 shows a trench MOSFET 103 according to a third exemplifying embodiment of the invention. Here terminal 43 is again implanted into drift zone 10, into first layer 20, and into second layer 30. An upper side of terminal 43 thus abuts, as in the first exemplifying embodiment, laterally against an upper side of n⁺ source 30. In addition, in the third exemplifying embodiment gate oxide 55 is thickened at least at the bottom of the trench.

The exemplifying starting material mentioned above, having an n-doped silicon carbide layer having a hexagonal crystal structure (4H-SiC substrate) and a lightly n-doped epitaxial silicon carbide drift zone (n-drift zone) 10, between which an n-doped silicon carbide buffer layer is disposed, can be used in particular in an exemplifying embodiment of the method according to the present invention. Firstly, building on the starting material, a heavily p-doped silicon carbide layer (p⁻ layer) 20 is epitaxially grown or implanted. A heavily n-doped silicon carbide layer (n⁺ source) 30 is epitaxially grown or implanted as the next layer. This n-doped silicon carbide layer 30 serves as a source terminal. A back side of 4H-SiC substrate 10 serves as a drain terminal.

Optionally, in the lateral region n⁺ source 30 is completely removed and p⁻ layer 20 is partly removed. A terminal is then formed by p⁺ implantation in the lateral region. The implanter used can implement implantations with an implantation depth that is sufficient that the terminal extends completely through p⁻ layer 20 into drift zone 10. A high-temperature step can follow in order to heal implantation defects and/or to activate the implanted substance(s).

A trench is now formed in the other lateral region, for example by depositing a masking material, patterning the masking material in accordance with a width of the trench, and etching the trench using the patterned masking material. The trench is formed in such a way that it extends through n⁺ source 30 and through p⁻ layer 20 into drift zone 10. The etching depth is selected here so that the trench extends into drift zone 10 at most as far as terminal 43. Preferably terminal 43 extends deeper into drift zone 10 than does the trench, for example a hundred nanometers or several hundred nanometers deeper.

Trench formation can encompass a further high-temperature step in order to adapt the trench shape.

A gate oxide 55 is then deposited in the trench. Alternatively or additionally, a thermal oxidation operation can be carried out by residence in a gas atmosphere, for example in a gas atmosphere containing nitrogen monoxide and/or dinitrogen monoxide. Gate oxide 55 can optionally be thickened in the bottom region of the trench.

A gate electrode 50, made e.g. of polycrystalline silicon, is then placed onto gate oxide 55. Gate electrode 50 can additionally be patterned.

The trench metal oxide semiconductor field effect transistor thereby manufactured can be used in a power semiconductor component that is suitable for applications in electric vehicles or photovoltaic facilities.

What is claimed is:

1. A substrate for a metal oxide semiconductor field effect transistor, comprising:
   an n-doped epitaxial drift zone;

a p⁻-doped epitaxial first layer disposed on the drift zone;
a heavily n-doped second layer disposed on the first layer; and
a terminal formed by p⁺ implantation, wherein:
  the first layer is in electrical contact with the terminal and is disposed laterally between the terminal and a trench,
  the trench is formed in the first layer, in the second layer, and in the drift zone,
  an implantation depth of the p⁺ implantation is at least as great as a depth of the trench,
  the terminal is formed in the first layer and in the drift zone,
  the terminal is formed in a region of the first layer in which the first layer is not covered by the second layer,
  the first layer is partly removed in the region, so that a trough is produced,
  the entire terminal formed by the p⁺ implantation is situated in a region laterally separated from the trench by the first layer,
  the drift zone is defined by a top surface of the n-doped epitaxial drift zone and a bottom surface of the n-doped epitaxial drift zone,
  the first layer is defined by a top surface of the p⁻-doped epitaxial first layer and a bottom surface of the p⁻- doped epitaxial first layer,
  the top surface of the drift zone directly and physically contacts the bottom surface of the p⁻- doped epitaxial layer, and
  a region extending in a vertical direction beneath the trench includes only the n-doped epitaxial drift zone.

2. The substrate as recited in claim 1, further comprising a gate electrode disposed in the trench in such a way that a vertical channel region is formed in the first layer.

3. The substrate as recited in claim 2, wherein the gate electrode is formed on an oxide layer that covers at least a bottom of the trench.

4. The substrate as recited in claim 1, the implantation depth is several hundred nanometers deeper than a depth of the trench.

5. The substrate for a metal oxide semiconductor field effect transistor of claim 1, wherein:
  the second layer is defined by a top surface of the heavily n-doped second layer and a bottom surface of the heavily n-doped second layer, and
  the top surface of the p⁻-doped epitaxial layer contacts the bottom surface of the heavily n-doped second layer.

6. The substrate for a metal oxide semiconductor field effect transistor of claim 1, wherein:
  the p⁺ implantation is situated in a region laterally separated from the trench by the first layer.

7. A metal oxide semiconductor field effect transistor, comprising:
an n-doped epitaxial drift zone;
a p⁻-doped epitaxial first layer disposed on the drift zone;
a heavily n-doped second layer disposed on the first layer;
a terminal, formed by p⁺ implantation, with which the first layer is in electrical contact; and
a trench, in which an oxide layer and thereupon a gate electrode are disposed so that the first layer is disposed laterally between the trench and the terminal, the trench being formed in the first layer, in the second layer, and in the drift zone, so that a vertical channel region can be formed in the first layer, wherein:
  an implantation depth of the p⁺ implantation is at least as great as a depth of the trench,
  the terminal is formed in the first layer and in the drift zone,
  the terminal is formed in a region of the first layer in which the first layer is not covered by the second layer,
  the first layer is partly removed in the region, so that a trough is produced,
  the entire terminal formed by the p⁺ implantation is situated in a region laterally separated from the trench by the first layer,
  the drift zone is defined by a top surface of the n-doped epitaxial drift zone and a bottom surface of the n-doped epitaxial drift zone,
  the first layer is defined by a top surface of the p⁻-doped epitaxial first layer and a bottom surface of the p⁻- doped epitaxial first layer,
  the top surface of the drift zone directly and physically contacts the bottom surface of the p⁻-doped epitaxial layer, and
  a region extending in a vertical direction beneath the trench includes only the n-doped epitaxial drift zone.

8. The metal oxide semiconductor field effect transistor of claim 7, wherein the implantation depth is several hundred nanometers deeper than a depth of the trench.

9. A method for manufacturing a metal oxide semiconductor field effect transistor, comprising:
providing a n-doped epitaxial drift zone;
disposing a p⁻-doped epitaxial first layer on the drift zone and a heavily n-doped second layer on the first layer;
forming a terminal in the first layer and in the drift zone by p⁺ implantation in a region of the first layer in which the first layer is not covered by the second layer, so that the first layer is in electrical contact with the terminal;
forming a trench in the first layer, in the second layer, and in the drift zone; and
forming a gate oxide in the trench and disposing a gate electrode in the trench, so that the first layer is disposed laterally between the trench and the terminal, so that a vertical channel region can be formed in the first layer, wherein:
an implantation depth of the p⁺ implantation is at least as great as a depth of the trench,
the first layer is partly removed in the region, so that a trough is produced,
  the entire terminal formed by the p⁺ implantation is situated in a region laterally separated from the trench by the first layer,
  the drift zone is defined by a top surface of the n-doped epitaxial drift zone and a bottom surface of the n-doped epitaxial drift zone,
  the first layer is defined by a top surface of the p⁻-doped epitaxial first layer and a bottom surface of the p⁻- doped epitaxial first layer,
  the top surface of the drift zone directly and physically contacts the bottom surface of the p⁻-doped epitaxial layer, and
  a region extending in a vertical direction beneath the trench includes only the n-doped epitaxial drift zone.

10. The method for manufacturing a metal oxide semiconductor field effect transistor of claim 9, wherein the implantation depth is several hundred nanometers deeper than a depth of the trench.

11. A motor vehicle, comprising:
a power switch that includes a metal oxide semiconductor field effect transistor, the transistor including:
  an n-doped epitaxial drift zone;

a p⁻-doped epitaxial first layer disposed on the drift zone;
a heavily n-doped second layer disposed on the first layer;
a terminal, formed by p⁺ implantation, with which the first layer is in electrical contact; and
a trench, in which an oxide layer and thereupon a gate electrode are disposed so that the first layer is disposed laterally between the trench and the terminal, the trench being formed in the first layer, in the second layer, and in the drift zone, so that a vertical channel region can be formed in the first layer, wherein:
an implantation depth of the p⁺ implantation is at least as great as a depth of the trench,
the terminal is formed in the first layer and in the drift zone,
the entire terminal formed by the p⁺ implantation is formed in a region of the first layer in which the first layer is not covered by the second layer,
the first layer is partly removed in the region, so that a trough is produced,
the terminal is situated in a region laterally separated from the trench by the first layer,
the drift zone is defined by a top surface of the n-doped epitaxial drift zone and a bottom surface of the n-doped epitaxial drift zone,
the first layer is defined by a top surface of the p⁻-doped epitaxial first layer and a bottom surface of the p⁻-doped epitaxial first layer,
the top surface of the drift zone directly and physically contacts the bottom surface of the p⁻-doped epitaxial layer, and
a region extending in a vertical direction beneath the trench includes only the n-doped epitaxial drift zone.

12. The motor vehicle of claim 11, wherein the implantation depth is several hundred nanometers deeper than a depth of the trench.

* * * * *